(12) United States Patent
Samavedan et al.

(10) Patent No.: US 10,243,059 B2
(45) Date of Patent: Mar. 26, 2019

(54) SOURCE/DRAIN PARASITIC CAPACITANCE REDUCTION IN FINFET-BASED SEMICONDUCTOR STRUCTURE HAVING TUCKED FINS

(71) Applicant: GLOBALFOUNDRIES INC., Grand Cayman (KY)

(72) Inventors: Srikanth Balaji Samavedan, Cohoes, NY (US); Manfred Eller, Beacon, NY (US); Min-hwa Chi, San Jose, CA (US); Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/994,614

(22) Filed: May 31, 2018

(65) Prior Publication Data
US 2018/0277655 A1 Sep. 27, 2018

Related U.S. Application Data

(62) Division of application No. 15/258,333, filed on Sep. 7, 2016, now Pat. No. 10,056,468.

(51) Int. Cl.
*H01L 29/423* (2006.01)
*H01L 29/06* (2006.01)
(Continued)

(52) U.S. Cl.
CPC .... *H01L 29/66545* (2013.01); *H01L 21/3085* (2013.01); *H01L 21/30604* (2013.01);
(Continued)

(58) Field of Classification Search
CPC ............. H01L 29/0649; H01L 29/4236; H01L 29/66795
See application file for complete search history.

(56) References Cited

U.S. PATENT DOCUMENTS 9,716,158 B1 7/2017 Cheng et al.
2013/0043490 A1* 2/2013 Sorada ................. H01L 21/044
257/77

(Continued)

*Primary Examiner* — Marc Anthony Armand
(74) *Attorney, Agent, or Firm* — Thompson Hine LLP; Francois Pagette

(57) ABSTRACT

A method of reducing parasitic capacitance includes providing a starting semiconductor structure, the starting semiconductor structure including a semiconductor substrate with fin(s) thereon, the fin(s) having at least two dummy transistors integrated therewith and separated by a dielectric region, the dummy transistors including dummy gates with spacers and gate caps, the fin(s) having ends tucked by the dummy gates. The method further includes removing the dummy gates and gate caps, resulting in gate trenches, protecting area(s) of the structure during fabrication process(es) where source/drain parasitic capacitance may occur, and forming air-gaps at a bottom portion of unprotected gate trenches to reduce parasitic capacitance. The resulting semiconductor structure includes a semiconductor substrate with fin(s) thereon, FinFET(s) integral with the fin(s), the FinFET(s) including a gate electrode, a gate liner lining the gate electrode, and air-gap(s) in gate trench(es) of the FinFET(s), reducing parasitic capacitance by at least about 75 percent as compared to no air-gaps.

7 Claims, 8 Drawing Sheets

(51) Int. Cl.
*H01L 29/66* (2006.01)
*H01L 29/78* (2006.01)
*H01L 21/306* (2006.01)
*H01L 21/308* (2006.01)

(52) U.S. Cl.
CPC ...... *H01L 29/0649* (2013.01); *H01L 29/4236* (2013.01); *H01L 29/66795* (2013.01); *H01L 29/785* (2013.01)

(56) References Cited

U.S. PATENT DOCUMENTS

| | | | |
|---|---|---|---|
| 2015/0255571 A1* | 9/2015 | Xu | H01L 29/6681 257/288 |
| 2017/0069661 A1 | 3/2017 | Zhang | |

* cited by examiner

SOURCE/DRAIN PARASITIC CAPACITANCE REDUCTION IN FINFET-BASED SEMICONDUCTOR STRUCTURE HAVING TUCKED FINS

CROSS REFERENCE TO RELATED APPLCATIONS

This application is a divisional application of U.S. patent application Ser. No. 15/258,333, filed Sep. 7, 2016, and entitled "SOURCE/DRAIN PARASITIC CAPACITANCE REDUCTION IN FINFET-BASED SEMICONDUCTOR STRUCTURE HAVING TUCKED FINS," the entirety of which is hereby incorporated herein by reference.

BACKGROUND OF THE INVENTION

Technical Field

The present invention generally relates to parasitic capacitance reduction in semiconductor devices. More particularly, the present invention relates to source and drain parasitic capacitance reduction in FinFET-based semiconductor structures having tucked fins.

Background Information

In the semiconductor industry, there is pressure to constantly improve the speed of semiconductor devices. For example, the market demands improvement in the speed of semiconductor memory and logic circuits. However, such memory and logic circuits need to reduce parasitic capacitance at the source and drain if they are to increase the speed of operation.

Thus, a need continues to exist for ways to reduce parasitic capacitance at the source/drain in memory/logic circuits.

SUMMARY OF THE INVENTION

The shortcomings of the prior art are overcome and additional advantages are provided through the provision, in one aspect, of a method of reducing parasitic capacitance. The method includes providing a starting semiconductor structure, the starting semiconductor structure including a semiconductor substrate, at least one fin with at least two dummy transistors integrated therewith, the at least two dummy transistors being separated by a dielectric region and including at least two dummy gates with spacers and at least two gate caps, the at least one fin having ends tucked by the at least two dummy gates. The method further includes removing the dummy gates and gate caps, the removing resulting in gate trenches, protecting at least one area of the structure during one or more fabrication processes where source/drain parasitic capacitance may occur, and forming air-gaps at a bottom portion of unprotected gate trenches.

In accordance with another aspect, a semiconductor structure is provided. The semiconductor structure includes a semiconductor substrate, at least one fin on the semiconductor substrate, at least one FinFET integral with the at least one fin, the at least one FinFET including a gate electrode, a gate liner lining the gate electrode, and at least one air-gap in at least one gate trench of the at least one FinFET.

These, and other objects, features and advantages of this invention will become apparent from the following detailed description of the various aspects of the invention taken in conjunction with the accompanying drawings.

DETAILED DESCRIPTION OF THE INVENTION

Figure 1:
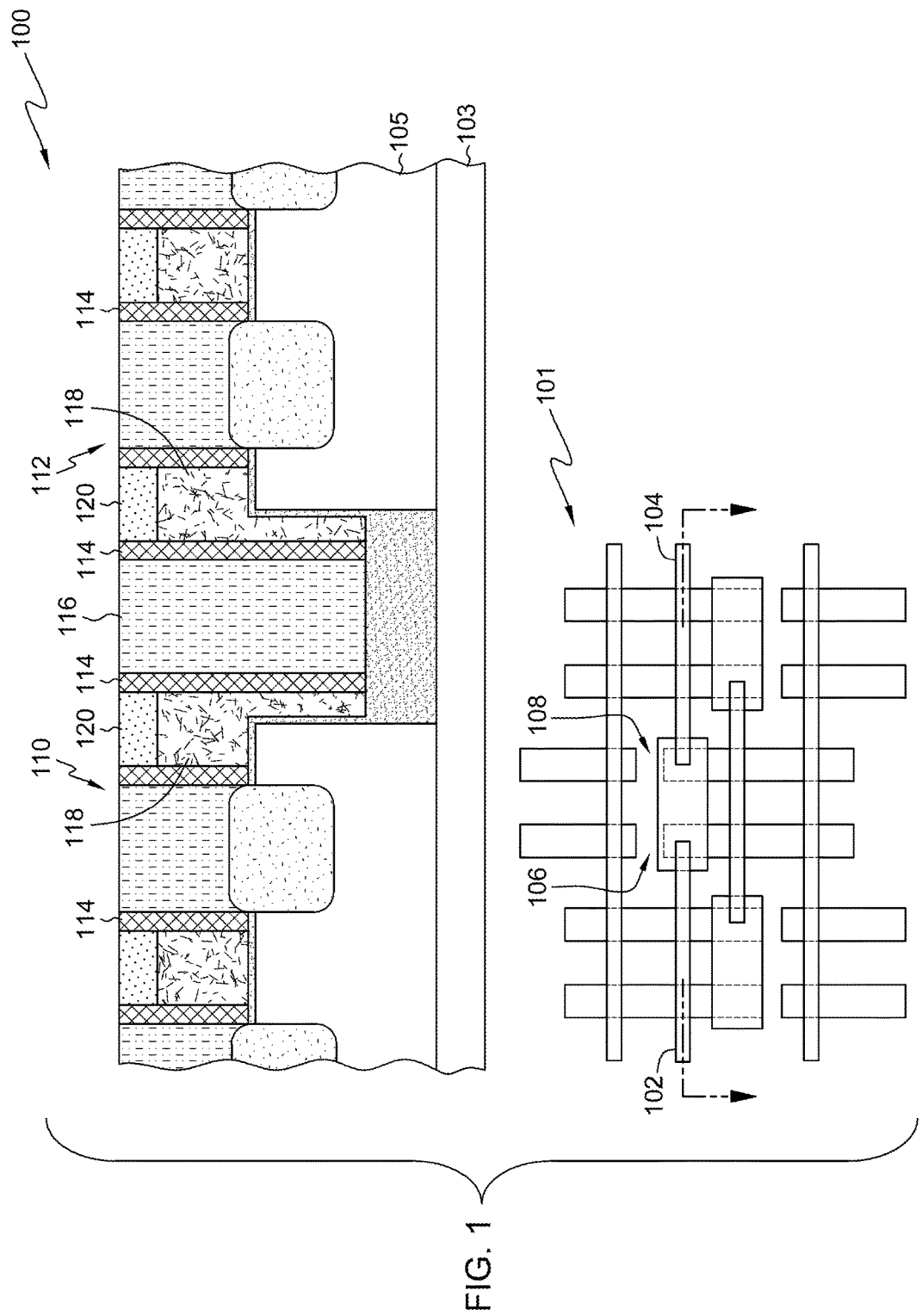
FIG. 1 is a cross-sectional view of one example of a starting semiconductor structure and a corresponding simplified top-down view, the cross-section taken along fins with tucked ends, respectively, the semiconductor structure including a semiconductor substrate, one or more fins on the substrate, at least two transistors in process situated on the semiconductor substrate with a low-k dielectric along sidewalls thereof, the at least two transistors separated by a dielectric region and including dummy gates and gate caps, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value.

As used herein, the term "dummy transistor" refers to a replacement gate transistor at a point in fabrication just prior to replacement of the dummy gate electrode with a dielectric gate electrode.

Reference is made below to the drawings, which are not drawn to scale for ease of understanding, wherein the same reference numbers are used throughout different figures to designate the same or similar components.

FIG. 1 is a cross-sectional view of one example of a starting semiconductor structure 100 and a corresponding simplified top-down view 101, the cross-section taken along fins 102 and 104 with tucked ends 106 and 108, respectively, the semiconductor structure including a semiconductor substrate 103, one or more fins 105 on the substrate, at least two transistors in process 110, 112 situated on the semiconductor substrate with a low-k dielectric 114 along sidewalls thereof, the at least two transistors separated by a dielectric region 116 and including dummy gates 118 and gate caps 120, in accordance with one or more aspects of the present invention. As used herein, the term "low-k dielectric" refers to a dielectric with a dielectric constant below 3.9 (i.e., below that of $SiO_2$).

The starting semiconductor structure may be conventionally fabricated, for example, using known processes and techniques. However, although only a portion is shown for simplicity, it will be understood that, in practice, many such structures are typically included on the same bulk substrate.

In one example, substrate 103 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

The fins may be, for example, etched from a bulk substrate, and may include, for example, any of the materials listed above with respect to the substrate.

Figure 2:
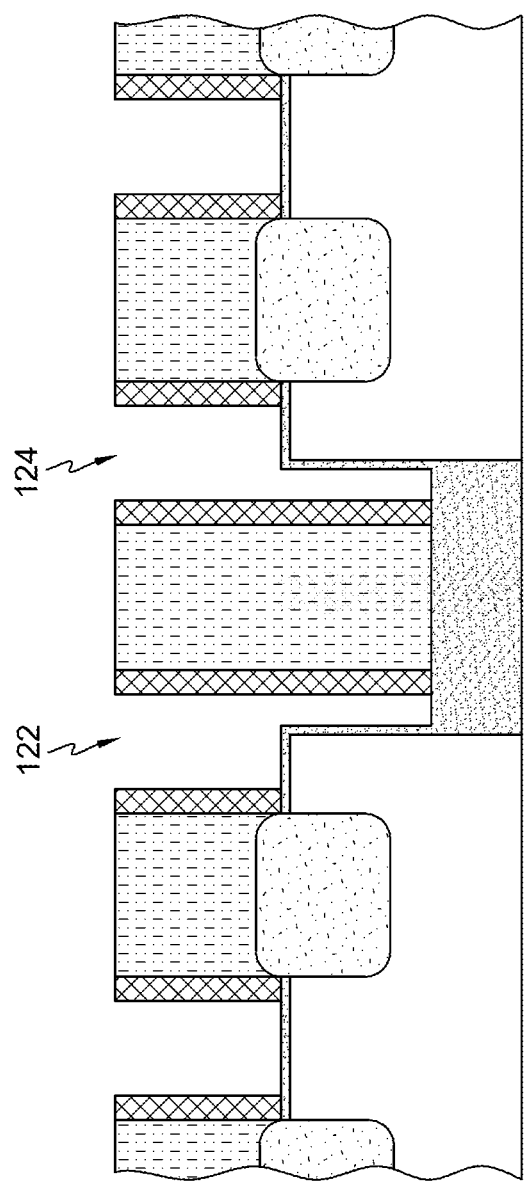
FIG. 2 depicts one example of the semiconductor structure of FIG. 1 after removal of the dummy gates and gate caps, resulting in gate trenches, in accordance with one or more aspects of the present invention.

FIG. 2 depicts one example of the semiconductor structure of FIG. 1 after removal of the dummy gates and gate caps (FIG. 1, 118 and 120), resulting in gate trenches 122 and 124, in accordance with one or more aspects of the present invention.

Figure 3:
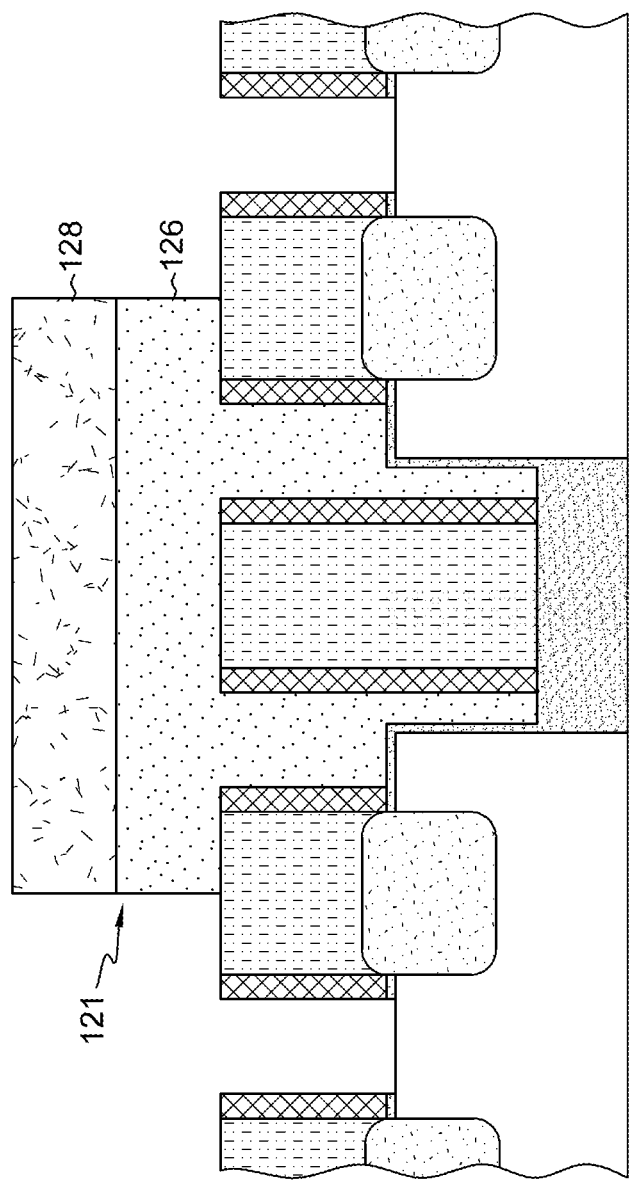
FIG. 3 depicts one example of the semiconductor structure of FIG. 2 after patterning and cleaning (e.g., DHF or SiCoNi process) the structure, except for an area of parasitic capacitance, including the gate trenches, with dielectric material (e.g., an organic dielectric), and a layer of lithographic blocking material (e.g., photo resist) thereover, in accordance with one or more aspects of the present invention.

FIG. 3 depicts one example of the semiconductor structure of FIG. 2 after patterning and cleaning (e.g., DHF or SiCoNi process) the structure, except for an area of parasitic capacitance 121, including the gate trenches (FIG. 2, 122 and 124), with a dielectric material 126 (e.g., an organic dielectric), and a layer of lithographic blocking material 128 (e.g., photoresist) thereover, in accordance with one or more aspects of the present invention. The purpose of the lithographic blocking layer is to protect source/drain areas where parasitic capacitance can take hold.

Figure 4:
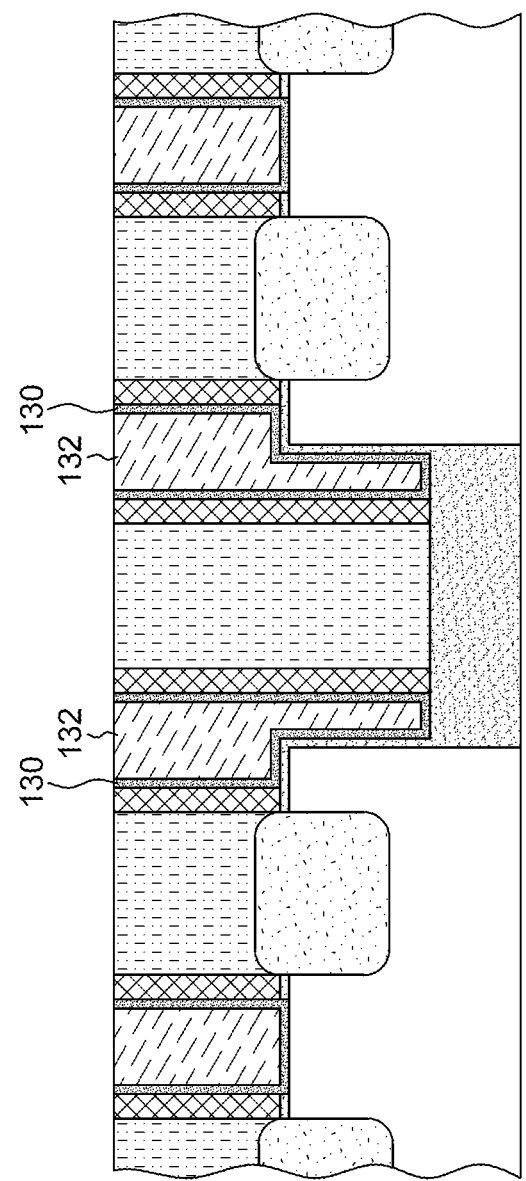
FIG. 4 depicts one example of the semiconductor structure of FIG. 3 after removal of the layer of lithographic blocking material and the dielectric layer, lining the gate trenches with a gate dielectric layer (e.g., oxide) and filling them with one or more dielectric materials, in accordance with one or more aspects of the present invention.

FIG. 4 depicts one example of the semiconductor structure of FIG. 3 after removal of the layer of lithographic blocking material (128, FIG. 3) and the dielectric layer (126, FIG. 3), lining the gate trenches (FIG. 2, 122 and 124) with a gate dielectric layer 130 (e.g., oxide) and filling them with one or more dielectric materials 132, in accordance with one or more aspects of the present invention.

Figure 5:
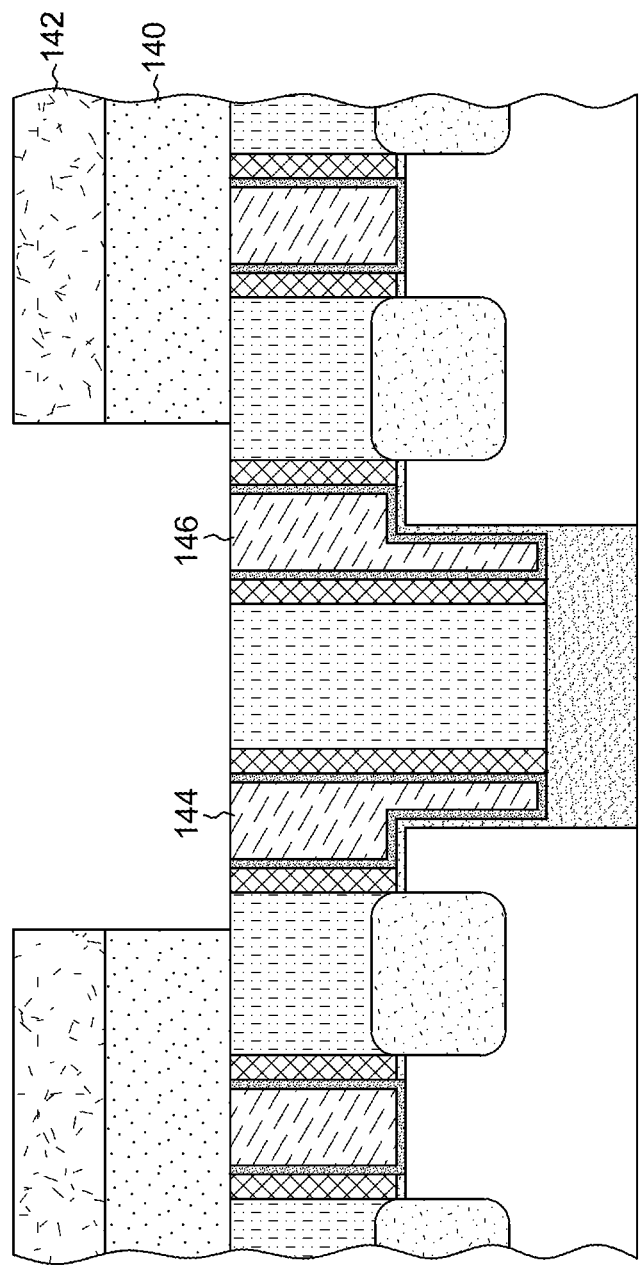
FIG. 5 depicts one example of the semiconductor structure of FIG. 4 after forming a dielectric layer (e.g., an organic dielectric) and a layer of lithographic blocking material (e.g., photoresist) over the dielectric layer, while leaving gate electrodes exposed, in accordance with one or more aspects of the present invention.

FIG. 5 depicts one example of the semiconductor structure of FIG. 4 after forming a dielectric layer 140 (e.g., an organic dielectric) and a layer of lithographic blocking material 142 (e.g., photoresist) over the dielectric layer, while leaving gate electrodes 144 and 146 exposed, in accordance with one or more aspects of the present invention.

Figure 6:
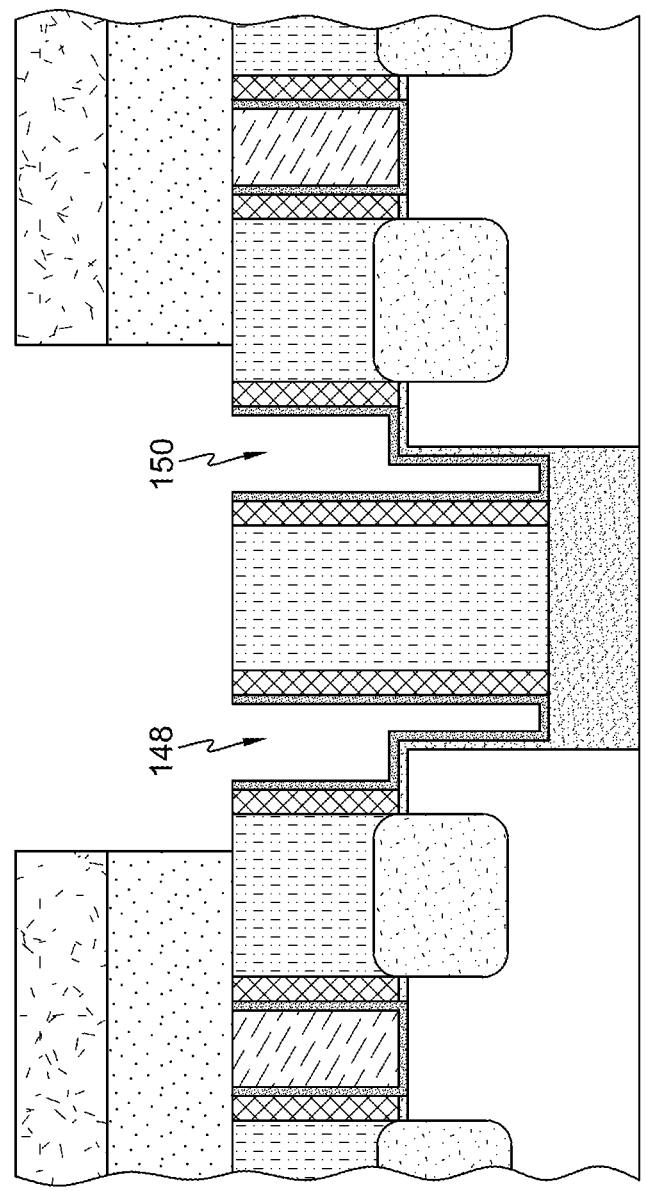
FIG. 6 depicts one example of the semiconductor structure of FIG. 5 after removing the gate electrodes, leaving lined gate trenches, in accordance with one or more aspects of the present invention.

FIG. 6 depicts one example of the semiconductor structure of FIG. 5 after removing gate electrodes 144 and 146, leaving lined gate trenches 148 and 150, respectively, in accordance with one or more aspects of the present invention.

Figure 7:
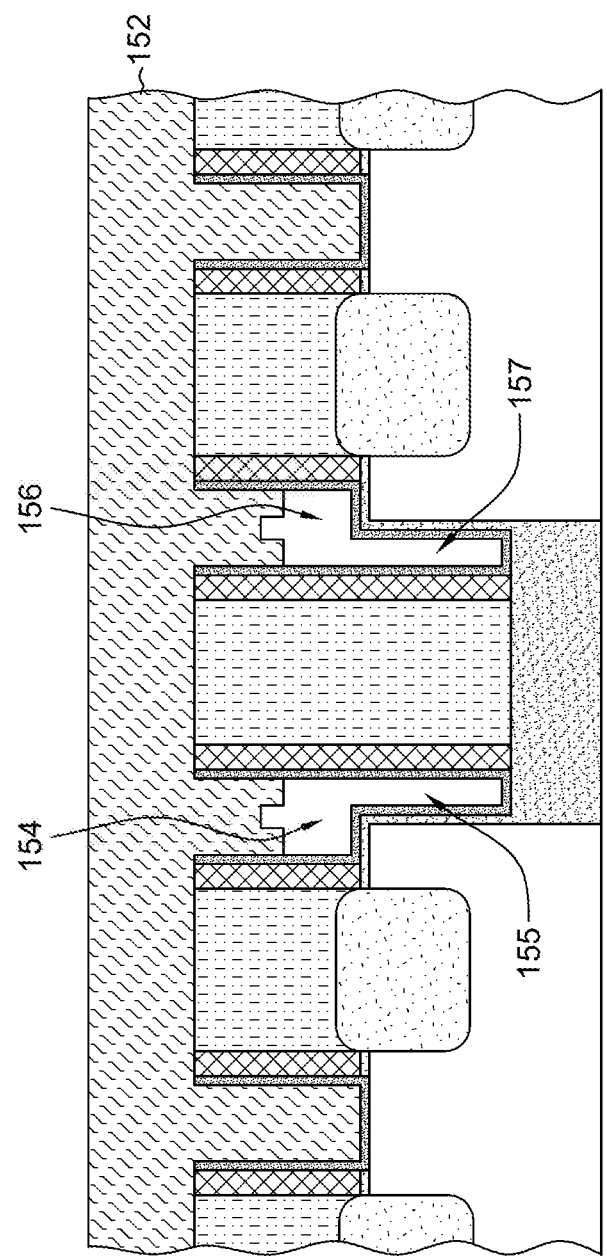
FIG. 7 depicts one example of the semiconductor structure of FIG. 6 after removing both the dielectric layer and the layer of lithographic blocking material, then filling with dielectric material(s) such that air-gaps are created, due to the small dimension (e.g., <10 nm) of the lined trenches at the lower portions, in accordance with one or more aspects of the present invention.

FIG. 7 depicts one example of the semiconductor structure of FIG. 6 after removing both dielectric layer 140 and the layer of lithographic blocking material 142, then filling with dielectric material(s) 152 such that air-gaps 154 and 156 are created, due to the small dimension (e.g., <10 nm) of the lined trenches 148 and 150 at the lower portions 155 and 157, respectively, in accordance with one or more aspects of the present invention. Forming the dielectric (e.g., silicon dioxide) may be accomplished with, for example, a deposition process, e.g., by CVD or PECVD method often characterized by a "filling" capability, i.e., a larger deposition rate at upper sidewall then at lower sidewall and bottom, so that the upper portion of a trench with small openings is often closed or sealed faster than the lower portions, such that a cavity or air-gap remains there. The air-gap is intentionally formed at the lower portion of narrow trench, by tuning the CVD parameters, so that the "lateral" portion of formation is larger than the "vertical" portion of formation, allowing air-gaps to be formed consistently.

The air-gaps (having a dielectric constant of 1) can therefore result in lower parasitic capacitance between the fins and the adjacent dielectric electrodes.

Figure 8:
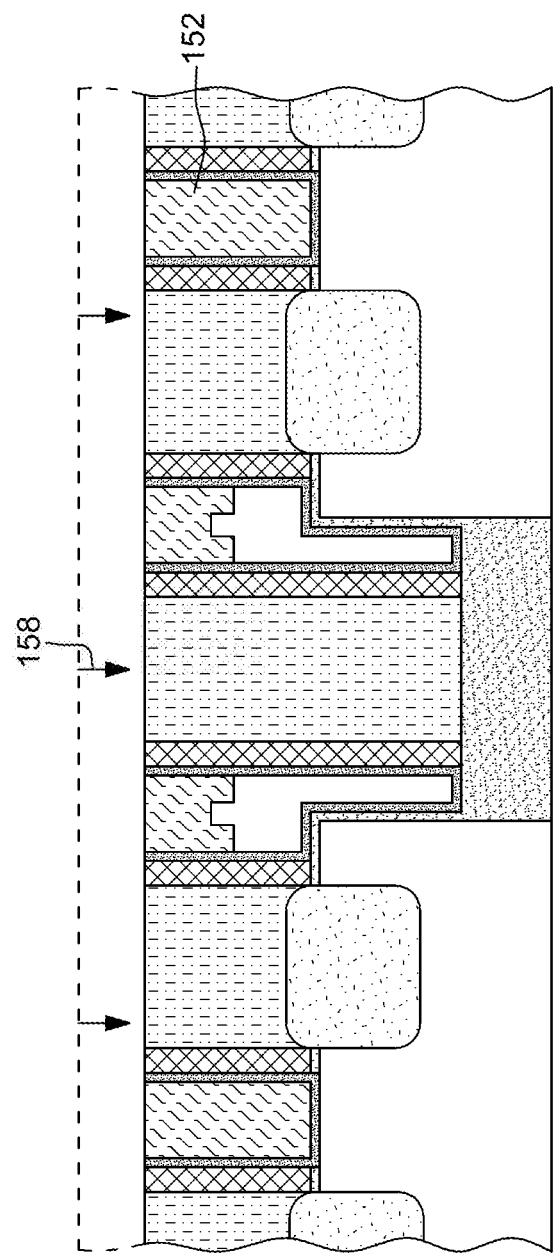
FIG. 8 depicts one example of the semiconductor structure of FIG. 7 after planarizing the dielectric material(s), in accordance with one or more aspects of the present invention.

FIG. 8 depicts one example of the semiconductor structure of FIG. 7 after planarizing 158 the dielectric material(s) 152, in accordance with one or more aspects of the present invention.

The air gaps of the present invention reduce parasitic capacitance at the source and drain in memory and logic circuits. In one example, the reduction in parasitic capacitance is at least about 75 percent, as compared to an absence of the air gaps. It should also be noted that the reduction is realized without any extra masks needed.

In a first aspect, disclosed above is a method. The method includes providing a starting semiconductor structure, the starting semiconductor structure including a semiconductor substrate, fin(s) with at least two dummy transistors thereon, the at least two dummy transistors integrated therewith being separated by a dielectric region and including at least two dummy gates with spacers and at least two gate caps, the fin(s) having ends tucked by the dummy gates. The structure further includes removing the dummy gates and gate caps, the removing resulting in gate trenches, protecting area(s) of the structure during fabrication processes where source/drain parasitic capacitance may occur, and forming air-gaps at a bottom portion of unprotected gate trenches.

In one example, the protecting may include for example, filling gate trench(s) with dielectric material, and forming a mask over the gate trench(s) after the filling. In one example, the mask may include, for example, an organic dielectric material. In one example, the mask may include, for example, a lithographic blocking material over the organic dielectric material.

In one example, the gate dielectric in the method of the first aspect may have, for example, a thickness of at least about 1 nm to about 10 nm.

In one example, forming the air-gaps in the method of the first aspect may include, for example, forming the air-gaps using dielectric material(s) and may further include, for example, removing the mask, resulting in exposed gate trenches, lining the exposed gate trenches with dielectric material(s), resulting in lined gate trenches, and filling the lined gate trenches with dielectric material.

In one example, the protecting in the method of the first aspect may include, for example, masking gate trench(es), etching and cleaning non-masked areas, and removing materials of the masking.

In one example, the method of the first aspect may further include, for example, filling at least some of the gate trenches with dielectric material(s), the filling resulting in at least some filled gate trenches and at least some unfilled gate trenches. The method may further include, for example, protecting the at least some filled gate trenches, the protecting resulting in at least some filled and protected gate trenches, and filling at least one of the at least some unfilled gate trenches with dielectric material(s) such that an air-gap is formed at a bottom region thereof, resulting in air-gap gate(s). In one example, the method may further include, for example, planarizing the structure after the filling that results in the air-gap gate(s).

In one example, the air-gap may include, for example, about 50 percent of a height of each gate electrode.

In one example, filling the at least some of the gate trenches may include, for example, filling all the gate trenches with dielectric material(s), resulting in filled gate trenches, protecting at least some of the filled gate trenches, the protecting resulting in unprotected filled gate trench(es), removing the dielectric material(s) from the unprotected filled gate trench(es), and refilling the unprotected gate trench(es) with dielectric material(s) such that an air-gap is formed at a bottom region thereof. In one example, the dielectric material(s) may have, for example, a thickness of about 1 nm to about 10 nm.

In one example, filling the at least some of the gate trenches in the method of the first aspect may include, for example, filling all the gate trenches with the dielectric material(s), resulting in filled gate trenches, protecting at least some of the filled gate trenches, the protecting resulting in at least one unprotected filled gate trench, removing the dielectric material(s) from the unprotected filled gate trench(es), and refilling the unprotected gate trench(es) with dielectric material(s) such that an air-gap is formed at a bottom region thereof.

In one example, the dielectric material(s) may have, for example, a thickness of about 1 nm to about 10 nm.

In a second aspect, disclosed above is a semiconductor structure. The semiconductor structure includes a semiconductor substrate, fin(s) on the semiconductor substrate, FinFET(s) integral with the fin(s), the FinFET(s) including a gate electrode, and a gate liner lining the gate electrode, and air-gap(s) in some gate trench(es) of the FinFET(s).

In one example, ends of the fin(s) may be, for example, tucked by gate(s).

In one example, a gate dielectric of the FinFET(s) of the semiconductor structure of the second aspect may include, for example, a low-k dielectric material. In one example, the gate dielectric may have, for example, a thickness of about 1 nm to about 10 nm.

In one example, the air-gaps of the semiconductor structure of the second aspect may be, for example, situated at a bottom region of the gate trench(e)s. In one example, the bottom region may include, for example, about 50 percent of a height of each gate electrode.

In one example, a gate dielectric layer of the FinFET(s) of the semiconductor structure of the second aspect may have, for example, a thickness of about 1 nm to about 10 nm.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A semiconductor structure, comprising:
   a semiconductor substrate;
   at least one fin on the semiconductor substrate;
   at least one FinFET integral with the at least one fin, the at least one FinFET comprising:
     a gate electrode;
     a gate liner lining a bottom and side walls of the gate electrode; and
     at least one air-gap in at least one gate trench of the at least one FinFET, wherein the air-gap comprises:
       an upper portion positioned between the side walls of the gate electrode; and
       a lower portion extending from the bottom of the gate electrode to the upper portion;
     wherein the lower portion has a width less than half a width of the upper portion.

2. The semiconductor structure of claim 1, wherein ends of the at least one fin are tucked by at least one gate.

3. The semiconductor structure of claim 1, wherein a gate dielectric of the at least one FinFET comprises a low-k dielectric material.

4. The semiconductor structure of claim 3, wherein the gate dielectric has a thickness of about 1 nm to about 10 nm.

5. The semiconductor structure of claim 1, wherein the air-gaps are situated at a bottom region of the at least one gate trench.

6. The semiconductor structure of claim 5, wherein the bottom region comprises about 50 percent of a height of each gate electrode.

7. The semiconductor structure of claim 1, wherein a gate dielectric layer of the at least one FinFET has a thickness of about 1 nm to about 10 nm.

* * * * *